United States Patent [19]
Shimizu et al.

[11] Patent Number: 5,739,543
[45] Date of Patent: Apr. 14, 1998

[54] OPTICAL SEMICONDUCTIVE DEVICE WITH INPLANAR COMPRESSIVE STRAIN

[75] Inventors: Hitoshi Shimizu; Michinori Irikawa, both of Tokyo, Japan

[73] Assignee: The Furukawa Electric Co., Ltd., Tokyo, Japan

[21] Appl. No.: 495,475

[22] PCT Filed: Nov. 24, 1994

[86] PCT No.: PCT/JP94/01980

§ 371 Date: Jul. 24, 1995

§ 102(e) Date: Jul. 24, 1995

[87] PCT Pub. No.: WO95/15022

PCT Pub. Date: Jun. 1, 1995

[30] Foreign Application Priority Data

Nov. 24, 1993 [JP] Japan ................. 5-317325

[51] Int. Cl.$^6$ .......... H01L 29/06; H01L 31/0328; H01L 31/0336

[52] U.S. Cl. .......... 257/14; 257/18; 257/21; 257/96; 257/97; 359/248; 372/43; 372/45; 372/46

[58] Field of Search ............... 257/21, 14, 18, 257/97, 96; 359/248; 372/46, 45, 43

[56] References Cited

U.S. PATENT DOCUMENTS

| | | | |
|---|---|---|---|
| 4,941,025 | 7/1990 | Tabatabaie | 357/16 |
| 5,181,086 | 1/1993 | Yoshida | 372/46 X |
| 5,319,660 | 6/1994 | Chen et al. | 372/45 |
| 5,337,326 | 8/1994 | Kan et al. | 372/45 |
| 5,339,325 | 8/1994 | Kito et al. | 372/45 |
| 5,521,935 | 5/1996 | Irikawa | 372/45 |

FOREIGN PATENT DOCUMENTS

| | | |
|---|---|---|
| 421 205 | 4/1991 | European Pat. Off. |
| 428 913 | 5/1991 | European Pat. Off. |
| 1-118817 | 5/1989 | Japan |
| 3-173440 | 7/1991 | Japan |
| 4-49688 | 2/1992 | Japan |
| 4-49689 | 2/1992 | Japan |
| 4-320082 | 11/1992 | Japan |
| 5-145178 | 6/1993 | Japan |
| 6-104534 | 4/1994 | Japan |
| 6-260719 | 9/1994 | Japan |

OTHER PUBLICATIONS

Handout for the 40th Assembly of the Japanese Institute of Applied Physics, Spring 1993, p. 1055.

Tan, G. et al., "Feles: A New 2D Software Design Tool for Optoelectronic Devices", Extended Abstracts of the 1992 International Conference on Solid State Devices and Materials, Tsukuba, 1992, pp. 249–251.

*Primary Examiner*—William Mintel
*Attorney, Agent, or Firm*—Jacobson, Price, Holman & Stern, PLLC

[57] ABSTRACT

The present invention provides an optical semiconductive device of a type wherein current is laterally injected toward the MQW structure to exhibit impartial distribution of carriers, low threshold current, enhanced optical output and improved response speed, in which an active layer has MQW structure 34, inplanar compression strain is included at least in well layer 34a or barrier 34b. The latent inplanar compression strain produces compressive stress, which serves to vary an energy bandwidth when injecting current in parallel with the MQW structure 34, so as to lessen effective mass of heavy holes; accordingly, those holes are accelerated, where carriers are impartially distributed to improve the device performance.

21 Claims, 5 Drawing Sheets

OPTICAL SEMICONDUCTIVE DEVICE WITH INPLANAR COMPRESSIVE STRAIN

BACKGROUND OF THE INVENTION

1. [Field of the Invention]

This invention relates to an optical semiconductive device and more particularly it relates to an optical semiconductive device that can suitably be used as a semiconductor optical amplifier device.

2. [Prior Art]

A number of different types of semiconductor laser device are known, including a quantum well type.

FIG. 7 of the accompanying drawings illustrates a known quantum well type laser device comprising an n-type semiconductor substrate 1, on which an n-type clad layer 2, an SCH (separate confinement heterostructure) layer 3, an MQW (multiquantum well) structure 4, an SCH layer 5, a p-type cladding layer 6, a p-type blocking layer 7, an n-type blocking layer 8, a p-type cap layer 9 are sequentially laid to form a multilayer structure. The device further comprises a p-electrode 10 arranged on the upper surface of the p-type cap layer 9 and an n-electrode 11 arranged under the lower surface of the n-type semiconductor 1.

FIG. 8 of the accompanying drawings schematically illustrates the profile of the energy band surrounding the MQW structure 4 of the quantum well type semiconductor laser device of FIG. 7.

If the MQW structure 4 includes a barrier layer 4a and a well layer 4b as shown in FIG. 8, the energy potential of the barrier layer 4a is tower than that, of the cladding layers 2 and 6 so that carriers can be injected into the well layer 4b with an enhanced efficiency. With such a low energy potential of the barrier layer 4a, however, the quantum effect of the quantum well type semiconductor laser device will be inevitably poor.

The energy potential of the barrier layer 4a may be raised to show a profile as shown in FIG. 9 in order to improve the quantum effect of the quantum well type semiconductor laser device and raise the laser performance. However, this improvement is then offset by a lowered efficiency with which carriers are injected into the well layer 4b.

As a major breakthrough in the above identified problem, Reference Document 1 scited below describes a device having an MQW layer structure into which an electric current can be transversally injected. FIG. 10 schematically shows a cross-sectional view of such a device.

Reference document 1: Handout in the 40th Assembly of the Japanese Institute of Applied Physics, Spring 1993, p1055.

The transversal electric current injection type semiconductor laser device as shown in FIG. 10 and described in Reference Document 1 comprises an Fe-doped InP substrate 21, on which a nondoped InP cladding layer 22, an InGaAsP-SCH layer 23, an InGaAs/InAlAs MQW structure 24, an n-InP buried layer 25, a p-InP buried layer 26, an n-InGaAsP cap layer 27 and p-InGaAsP cap layer 28 are sequentially stratified to form a multilayer structure. An n-electrode 29 is arranged on the upper surface of one cap layer 27, while a p-electrode 30 is arranged on the other cap layer 28.

Electrons are injected from the n-InP buried layer 25 while holes are injected from the p-InP buried layer 26 of the transverse electric current injection type semiconductor laser device of FIG. 10.

In the above described transverse electric current injection type semiconductor laser device, since holes that dominate laser oscillation and move in tile plane of the quantum well layer have a large mass and therefore poor mobility, they cannot diffuse smoothly along the injected direction.

When a voltage is transversely applied as forward bias applied to the n-InP buried layer 25, the MQW well structure 24 and the p-InP buried layer 26 of the device, the density distribution pattern of holes in the MQW layer structure 24 shows a profile that declines from the p-side toward the n-side. Such a declining profile of the density distribution pattern of holes is theoretically proved by simulation in Reference Document 2 listed below.

Reference Document 2: Extended Abstracts of the 1992 International Conference on Solid State Devices and Materials, p249.

When the density distribution of holes in the MQW structure 24 is as mentioned above, the density distribution of electrons also follows almost the same pattern, because the electric charge of the device is neutral as a whole. Such distorted distribution patterns inevitably give rise to uneven carrier distribution along with uneven gain distribution.

In short, a transverse electric current injection type semiconductor laser device as illustrated in FIG. 10 has difficulty in displaying efficient performance of laser emission because of a rise in the threshold current, a saturated optical output and a drop in the response speed to be caused by uneven carrier distribution and uneven gain distribution.

SUMMARY OF THE INVENTION

In view of the above identified technological problems, it is an object of the invention to provide an improved semiconductor optical device which features even carrier distribution, low threshold current, high optical output and high-speed operation.

According to the invention, the above object is achieved by providing an optical semiconductive device for lateral current injection to the MQW layer structure thereof including inplanar compression strain at least, in a well layer or a barrier layer which forms part of the MQW layer structure.

Embodiment modes of the present invention are as follows:

The compressive strain of the well layer and/or the barrier layer ranges from 0.1 to 3%, or thereabout.

The MQW structure may be of a strain compensation type.

An optical confinement layer having an SCH or GRIN-SCH (graded index separate confinement heterostructure) structure may be arranged on the upper side and/or the lower side of the active layer having an MQW structure.

The well layer brining part of the MQW structure or the optical confinement, layer may have a multiquantum barrier (MQB) structure. If such is the case, the MQB structure may be of strained superlattice structure.

The MQW structure has a well layer and a barrier layer, either or both of which are of compressive strain; the compressive strain layer may be modulation P-doped.

A well layer and a barrier layer for the MQW structure can be made of GaInAs or GaInAsP, and AlInAs or AlGaInAs, respectively. Instead, the former may consist of GaInAs or AlGaAs, while the latter can be made of AlInAs or AlGaInAs.

In a semiconductor optical device according to the invention, at, least either the well layer or the barrier layer constituting the MQW structure has an inplanar compressive strain. In other words, the well layer and/or the barrier layer is subject to inplanar compression stress that can produce inplanar compressive strain.

If the well layer and/or the barrier layer comprises a compressive strain layer, the energy band structure can be modified by compression stress and, when an electric current is injected into the multiquantum well layer structure in a parallel direction relative to the structure, the effective mass of holes can be reduced in an inplanar direction.

Thus, in an optical semiconductive device according to the invention, holes show an improved mobility so that carriers are evenly and uniformly distributed to improve the performance (of, for example, laser emission) of the device.

DESCRIPTION OF BEST MODES OF CARRYING OUT THE INVENTION

Figure 1:
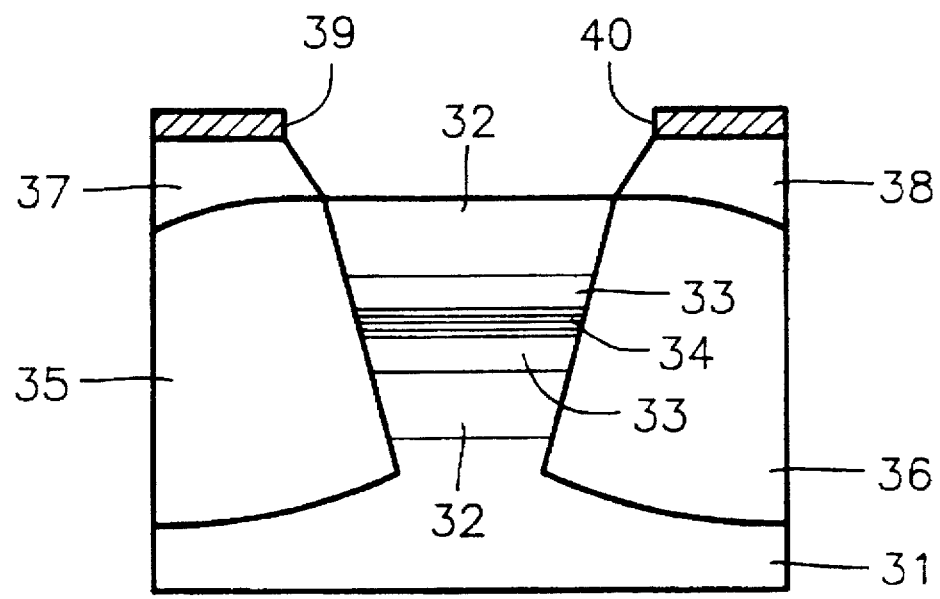
FIG. 1 is a schematic cross sectional view of an embodiment of an optical semiconductive device according to the invention.
Figure 2:
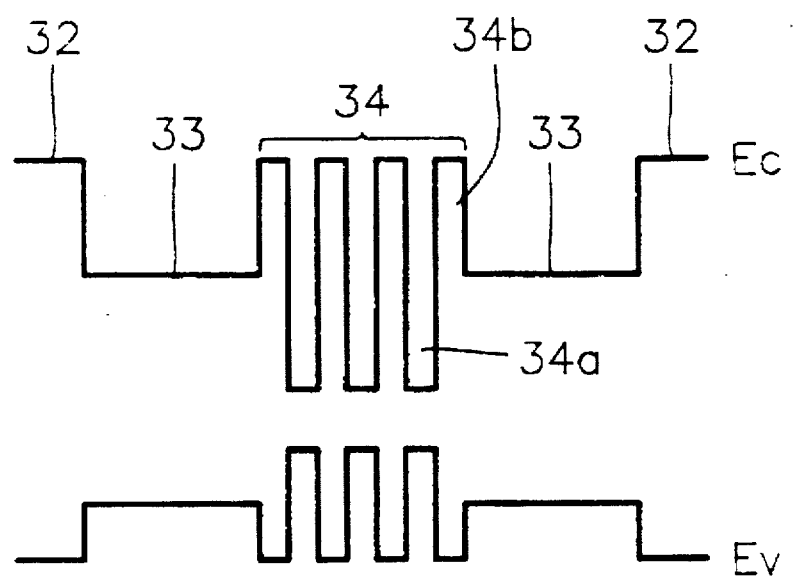
FIG. 2 is a schematic partial view of the embodiment of FIG. 1, showing the energy band structure of the active layer and its vicinity.

Firstly, a preferred embodiment of a semiconductor optical device according to the invention is described by referring to FIGS. 1 and 2.

FIG. 1 is a schematic cross-sectional view of an embodiment of the optical semiconductive device according to the invention, which is in fact a semiconductor laser device and FIG. 2 is a schematic partial view of the embodiment of FIG. 1, showing the energy band structure of the active layer and its vicinity.

The semiconductor laser device of FIGS. 1 and 2 comprises a substrate 31, on which a clad layer 32, an optical confinement layer 33, an MQW structure 34, an n-type buried layer 35, a p-type buried layer 36, an n-type contact layer 37 and a p-type contact layer 38 are stratified to form a multilayer structure. An n-electrode 39 is arranged on the contact layer 37, while a p-electrode 40 is mounted on the contact layer 38.

The component layers of the above embodiment are preferably made of materials as described below.

The substrate 31 is made of semi-insulating InP and the cladding layer 32 is made of nondoped InP measuring 1 μm in thickness.

The optical confinement layer 33 has an SCH structure and is made of nondoped $In_{0.52}Ga_{0.24}Al_{0.24}As$ with a thickness of 0.2 μm.

The MQW structure 34 comprises a well layer 34a and a barrier layer 34b, of which the well layer 34a has inplanar compressive strain to an extent of 0.1 to 3%. The well layer 34a is 3.8 nm thick and is made of $In_{0.70}Ga_{0.30}As$, while the barrier layer 34b is 8 nm thick and is made of $In_{0.52}Al_{0.48}As$.

It is true that, the MQW structure 34 may have any number of wells within the critical film thickness for misfit dislocation; this embodiment has four wells.

Alternatively, the well layer 34a and the barrier layer 34b of the MQW structure 34 may be made of GaInAsP and AlGaInAs, respectively. Still alternatively, the well layer 34a and the barrier layer 34b of the MQW structure 34 may be made of AlGaInAs and AlGaInAs, respectively.

The buried layer 35 is made of n-InP and the buried layer 36 is made of p-InP.

The contact layer 37 is 0.4 μm thick and it is made of $n-In_{0.53}Ga_{0.47}As$, while the contact layer 38 is 0.4 μm thick and is also made of $In_{0.53}Ga_{0.47}As$.

The, n-electrode 39 and the p-electrode 40 are made of at least one conductive noble metal or an alloy of at least one conductive noble metal well known in the art. More specifically, the n-electrode 39 is made of Au-Ge-Ni or Au and tile p-electrode 40 is made of Au-Zn or Ti-Pt-Au.

In addition, the above III-V group compound semiconductor may be replaced by a II-VI group compound semiconductor or a IV-IV group compound semiconductor. The optical confinement layer 33 may have a GRIN-SCH structure. Furthermore, the barrier layer 34b may have compressive strain to an extent of about 0.1 to 3% or both the well layer 34a and the barrier layer 34b may have compressive strain to the same extent.

Since the MQW structure 34 of the optical semiconductive device (a semiconductor laser device for a wavelength band of 1.55 μm) illustrated in FIGS. 1 and 2 has compressive strain, the holes exhibit improved mobility when an electric current is injected in parallel to the multi-quantum well structure 34.

Thus, the semiconductor laser device has an even carrier distribution and serves efficiently as a laser device.

Figure 3:
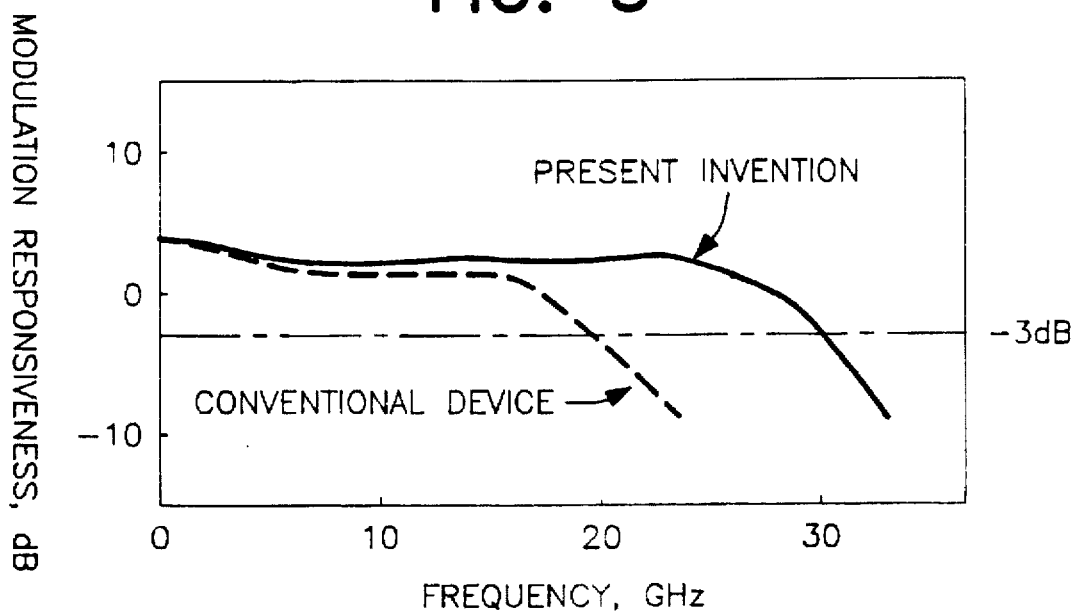
FIG. 3 is a graph showing in comparison the modulation response to small signals of an optical semiconductive device according to the invention and that of a conventional device.

FIG. 3 is a graph showing in comparison the modulation response to small signals of an optical semiconductive device according to the invention and that of a conventional device. As clearly seen from FIG. 3, the device of the invention shows a wide modulation band width of 30 GHz for small signals (−3 dB and above), where the conventional device (clad-free current injection type having a conventional MQW structure or longitudinal current injection type) has a relatively narrow modulation band width of 20 GHz.

Figure 4:
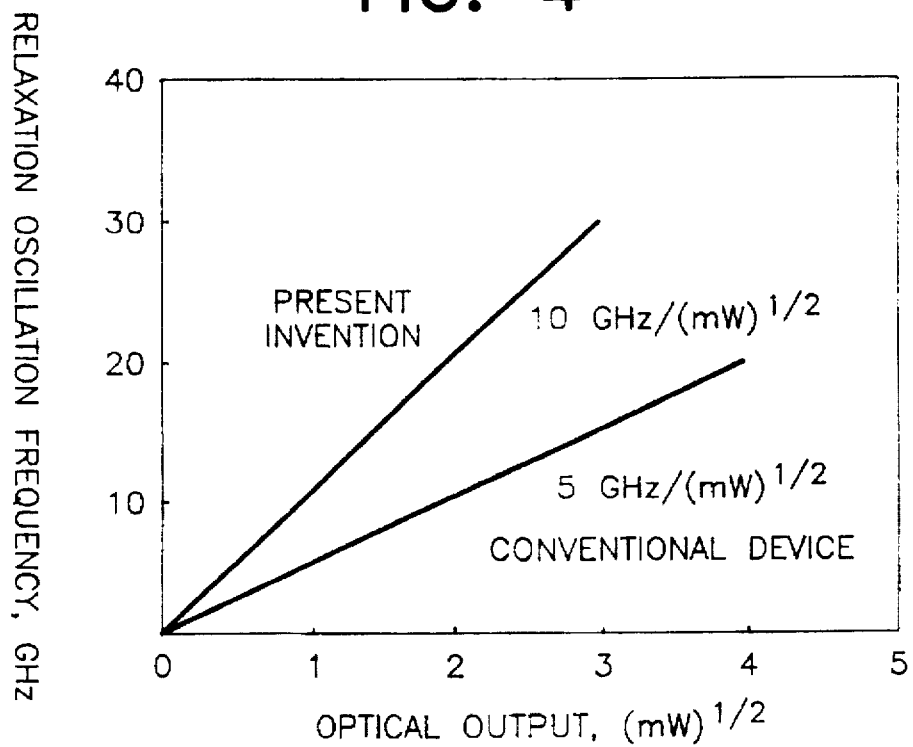
FIG. 4 is a graph showing in comparison the optical output dependency of the relaxation oscillation frequency of an optical semiconductive device according to the invention and a conventional device.

FIG. 4 is a graph showing in comparison the optical output dependency of the relaxed oscillation frequency of a semiconductor laser device according to the invention and a conventional device. As clearly seen from FIG. 4, the device of the invention exhibits a high efficiency of 10 $GHz/(mW)^{1/2}$, whereas the conventional device (type of lateral current injection toward the MQW structure having a conventional MQW structure or a longitudinal current injection type) has a relatively low efficiency of 5 $GHz/(mW)^{1/2}$. An optical device having a high efficiency according to the invention can be made to exhibit a wide band width with a low optical output level or current level.

Figure 5:
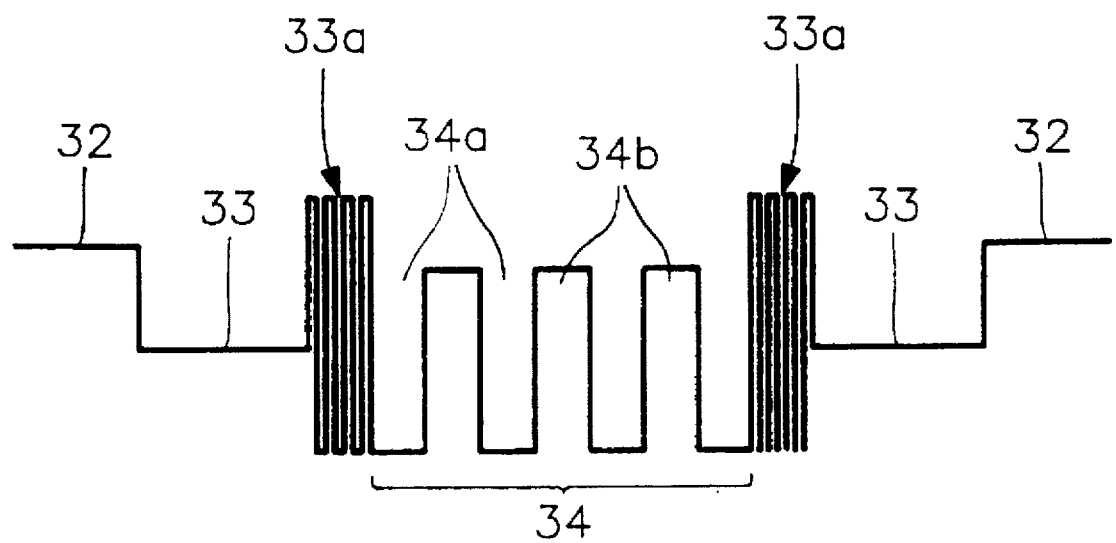
FIG. 5 is a schematic partial view of another embodiment of the invention, showing the conduction band energy structure of the active layer and its vicinity.

Now a second embodiment of the semiconductor optical device according to the invention is described by referring to FIG. 5. This device is in fact a semiconductor laser device.

FIG. 5 shows the conduction band energy structure of the active layer and its vicinity of the semiconductor laser device, wherein the active layer has an MQW structure 34 which comprises a barrier layer 34b having compressive strain as described above and an optical confinement layer 23 having an MQB structure 33a. Otherwise, the embodiment is substantially the same as the one shown in FIGS. 1 and 2.

Referring to the semiconductor laser device of FIG. 5, the optical confinement layer 33 is 0.2 μm thick and is made of $Al_{0.24}In_{0.52}Ga_{0.24}As$, while the MQB structure 33a comprises ten AlInAs barrier sublayers with −0.5% strain (tensile strain) and ten GaInAs well sublayers with ±0% strain (no strain).

Referring to the semiconductor laser device of FIG. 5, the MQW structure 34 comprises a 12 nm thick GaInAs well layer 34a with strain of −0.5% (tensile strain) and an 8 nm thick AlInAs barrier layer 34b with strain of +0.5% (compressive strain). The number of wells is five in this device.

In the semiconductor laser device (1.55 μm wavelength band), since the barrier layer 34b of the MQW structure 34 has compressive strain, it exhibits an improved hole mobility when an electric current is injected in parallel relative t,o the MQW structure 34. Additionally, since the optical confinement layer 33 has an MQB structure 33a, any overflow of carriers from the active layer to the optical confinement layer 33 is reduced by the MQB structure 33a to further improve the laser emission performance of the device.

If the barrier layer 34b of the semiconductor laser device of FIG. 5 is doped with Be to an extent of $1 \times 10^{18}$ cm$^{-3}$, holes can be injected much more easily. In such a doping operation, it is preferable to dope particularly the center of the barrier layer 34b. Then, Be is dispersed throughout the barrier layer 34b but not into the well layer 34a.

Figure 6:
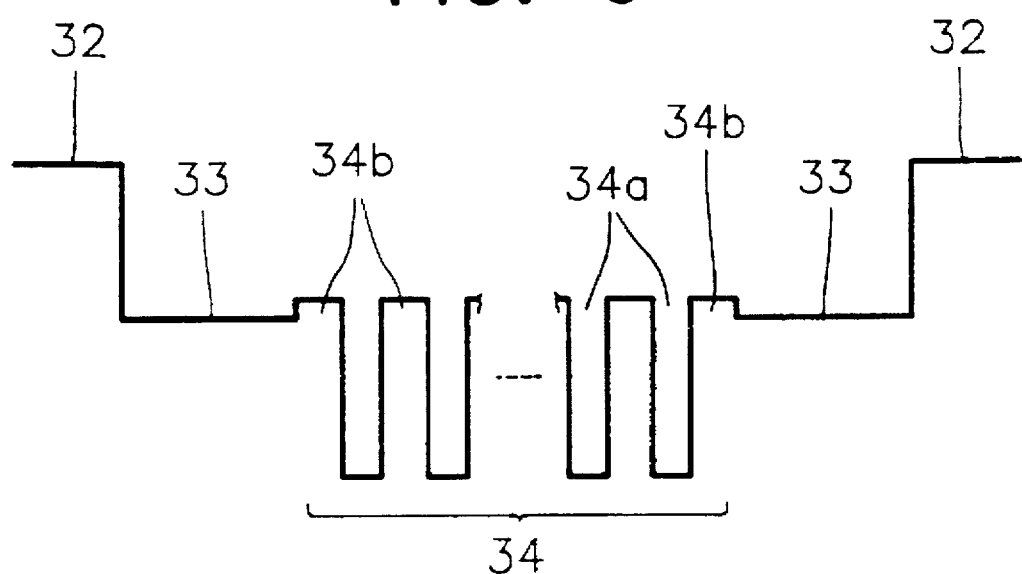
FIG. 6 is a schematic partial view of still another embodiment of the invention, showing the conduction band energy structure of the active layer and its vicinity.
Figure 7:
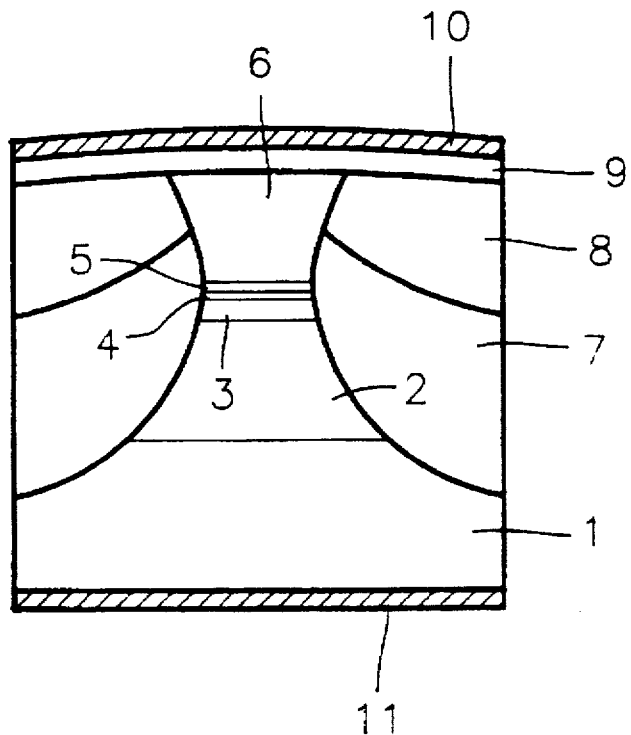
FIG. 7 is a schematic cross sectional view of a conventional quantum well type semiconductor laser device.
Figure 8:
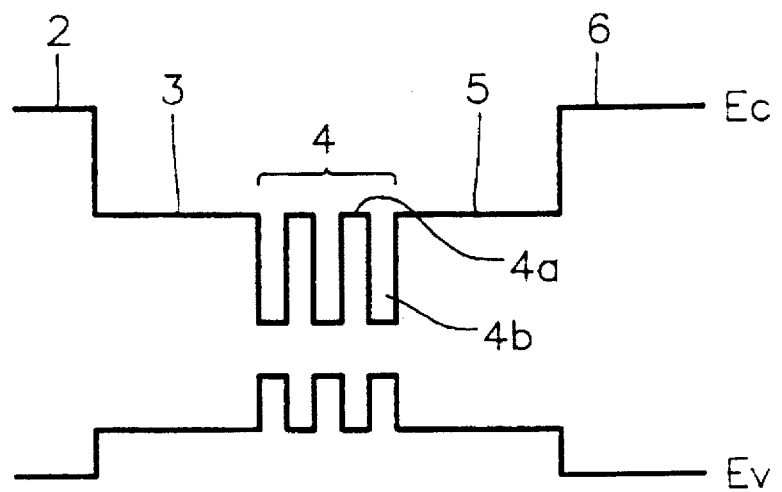
FIG. 8 is a schematic partial view of the quantum well type semiconductor laser device of FIG. 7, showing the energy band structure of the active layer and its vicinity.
Figure 9:
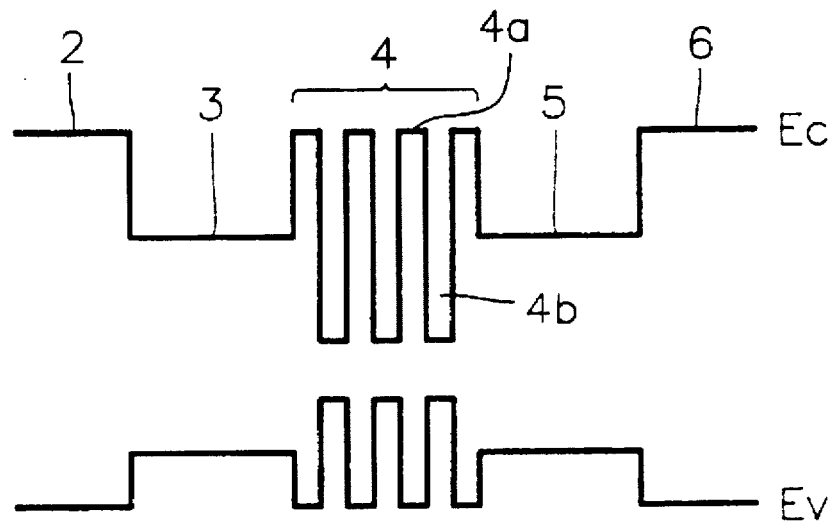
FIG. 9 is a schematic partial view of the quantum well type semiconductor laser device of FIG. 7, showing the energy band structure when the energy potential of the barrier layer is raised.
Figure 10:
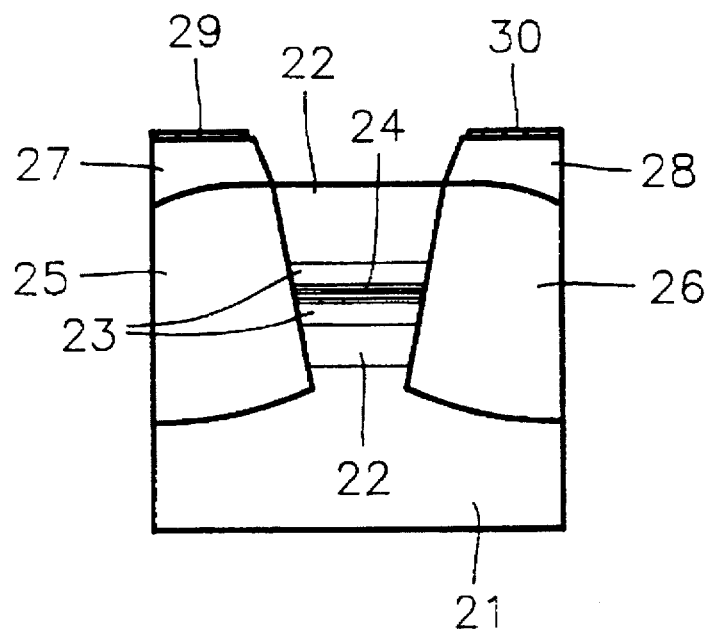
FIG. 10 is a schematic cross sectional view of a known transverse electric current, injection type semiconductor laser device.

Now, a still further embodiment of the semiconductor optical device according to the invention is described by referring to FIG. 6.

FIG. 6 shows the conduction band energy structure of the active layer and its vicinity. This embodiment is, in fact, a semiconductor laser device. The MQW structure 34 is of a strain compensation type, where, if otherwise, it has a configuration substantially the same as or similar to that of the embodiments of FIGS. 1, 2 and 5.

With reference to the semiconductor laser device of FIG. 6, the optical confinement layer 33 measures 0.2 μm in thickness and consists of $Al_{0.30}Ga_{0.17}In_{0.53}As$, while the strain compensation type MQW structure 34 comprises a 5 nm thick $In_{0.68}Ga_{0.32}As$ with deformation of +1.0% and an 8 nm thick $Al_{0.35}Ga_{0.21}In_{0.44}As$ barrier layer 34b with deformation of −0.58%. The number of wells in this embodiment is eight.

In the semiconductor laser device of FIG. 6 (1.55 μm wavelength band), since the well layer 34a of the MQW structure 34 has compressive strain, it exhibits an improved hole mobility when an electric current is injected in parallel to the MQW structure 34 as in the case of the preceding embodiments. Additionally, since the MQW structure 34 is of a strain compensation type, the amount of the conduction band energy discontinuity (ΔEc) of the well layer 34 and the barrier layer 34b can be made greater than that of the lattice matching type structure or the ordinary strained MQW structure.

Thus, the semiconductor laser device of FIG. 6 can be expected to perform better than the preceding embodiments (See FIGS. 3 and 4).

If the barrier layer 34b of the strain compensation type structure is made of AlGaInAs or a similar material and formed with tension deformation, keeping the Al content on a constant level, the band gap energy of the layer can be increased to consequently raise the value of ΔEc.

The Al content of the barrier layer is preferably held to a low level because, if it is high, the barrier layer can become structurally defective as aluminum is oxidized.

To the contrary, if the MQW structure 34 is of the strain compensation type, the Al content level can be reduced, keeping a high value For ΔEc. Thus, a high-quality and high-performance semiconductor laser device can be obtained by such an arrangement.

As described above in detail, while a semiconductor optical device according to the invention can be easily realized as a semiconductor laser device, it, may alternatively be realized in the form of a different device, such as a semiconductor optical amplifier device, which is also of high quality and high performance.

A semiconductor optical device according to the invention can be prepared by any known appropriate technique such as epitaxial growth, photolithography, cleavage, electrode or met, a/vapor deposition and realized in the form of a packaged device.

[Advantages]

Since a semiconductor optical device of the sideling current injection toward the MQW structure according to the invention comprises a well layer and a barrier layer constituting an MQW structure, of which at least either one has compressive strain, the energy band of the device is structurally modified by inplanar compression stress to reduce the effective mass of holes along an inplanar direction. This encourages holes to increase their mobility to realize uniform carrier distribution and improve the performance of the device.

Thus, a high-quality and -performance semiconductor optical device according to the invention can operate excellently as an optical device, such as a semiconductor laser device or a semiconductor optical amplifier device.

What is claimed is:

1. An optical semiconductive device having MQW layers, in which current is laterally injected so as to flow parallel to said MQW layers, said MQW layers comprising at least a well layer with inplanar compressive strain applied thereto.

2. The optical semiconductive device according to claim 1, wherein the MQW layers are arranged so as to compensate for inplanar compressive strain.

3. The optical semiconductive device according to claim 1, wherein the MQW layers have at least one of an upper and lower optical confinement layers.

4. The optical semiconductive device according to claim 3, wherein each optical confinement layer has an SCH structure.

5. The optical semiconductive device according to claim 3, wherein each optical confinement layer has a GRIN-SCH structure.

6. The optical semiconductive device according to claim 1, wherein each optical confinement layer has an MQB structure.

7. The optical semiconductive device according to claim 1, wherein the well layer is applied with compressive strain.

8. The optical semiconductive device according to claim 1, wherein each layer having inplanar compressive strain applied thereto is P-doped.

9. The optical semiconductive device according to claim 1, wherein the well layer is GaInAs or GaInAsP.

10. The optical semiconductive device according to claim 1, wherein the well layer is AlGaInAs.

11. An optical semiconductive device having MQW layers, in which current is laterally injected so as to flow parallel to said MQW layers, said MQW layers comprising at least a barrier layer with inplanar compressive strain applied thereto.

12. The optical semiconductive device according to claim 11, wherein the MQW layers are arranged so as to compensate for inplanar compressive strain.

13. The optical semiconductive device according to claim 11, wherein the MQW layers have at least one of an upper and lower optical confinement layer.

14. The optical semiconductive device according to claim 13, wherein each optical confinement layer has an SCH structure.

15. The optical semiconductive device according to claim 13, wherein each optical confinement layer has a GRIN-SCH structure.

16. The optical semiconductive device according to claim 11, wherein the barrier layer has an MQB structure.

17. The optical semiconductive device according to claim 11, wherein each optical confinement layer has an MQB structure.

18. The optical semiconductive device according to claim 11, wherein the barrier layer is applied with compressive strain.

19. The optical semiconductive device according to claim 11, wherein each layer having inplanar compressive strain applied thereto is P-doped.

20. The optical semiconductive device according to claim 11, wherein the barrier layer is GaInAs or AlGaAs.

21. The optical semiconductive device according to claim 16, wherein the MQB structure has a strained superlattice structure.

* * * * *